United States Patent
Lof et al.

(10) Patent No.: US 7,081,943 B2
(45) Date of Patent: *Jul. 25, 2006

(54) LITHOGRAPHIC APPARATUS AND DEVICE MANUFACTURING METHOD

(75) Inventors: Joeri Lof, Eindhoven (NL); Joannes Theodoor De Smit, Eindhoven (NL); Roelof Aeilko Siebrand Ritsema, Eindhoven (NL); Klaus Simon, Eindhoven (NL); Theodorus Marinus Modderman, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 2 days.

This patent is subject to a terminal disclaimer.

(21) Appl. No.: 10/705,805

(22) Filed: Nov. 12, 2003

(65) Prior Publication Data

US 2004/0165159 A1    Aug. 26, 2004

(30) Foreign Application Priority Data

Nov. 12, 2002   (EP)  .................................. 02257822

(51) Int. Cl.
  *G03B 27/52*   (2006.01)
  *G03B 27/42*   (2006.01)
(52) U.S. Cl. ............................ 355/30; 355/53; 355/55; 355/63
(58) Field of Classification Search ................. 355/55, 355/53, 30, 63, 72, 75, 77; 250/548, 492.2; 359/380

See application file for complete search history.

(56) References Cited

U.S. PATENT DOCUMENTS

| | | |
|---|---|---|
| 3,573,975 A | 4/1971 | Dhaka et al. ................ 117/212 |
| 3,648,587 A | 3/1972 | Stevens ........................... 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ............ 430/326 |
| 4,480,910 A | 11/1984 | Takanashi et al. ............. 355/30 |
| 4,509,852 A | 4/1985 | Tabarelli et al. ............... 355/30 |
| 5,040,020 A | 8/1991 | Rauschenbach et al. ....... 355/53 |
| 5,121,256 A | 6/1992 | Corle et al. .................. 359/664 |
| 5,610,683 A | 3/1997 | Takahashi ...................... 355/53 |
| 5,715,039 A | 2/1998 | Fukuda et al. .................. 355/53 |
| 5,825,043 A | 10/1998 | Suwa .......................... 250/548 |
| 5,900,354 A | 5/1999 | Batchelder ................... 430/395 |
| 6,191,429 B1 | 2/2001 | Suwa .......................... 250/548 |
| 6,236,634 B1 | 5/2001 | Lee et al. .................... 369/112 |
| 6,560,032 B1 | 5/2003 | Hatano ........................ 359/656 |
| 6,600,547 B1 | 7/2003 | Watson et al. | 
| 6,603,130 B1 | 8/2003 | Bisschops et al. ........ 250/492.1 |
| 6,633,365 B1 | 10/2003 | Suenaga ....................... 355/53 |
| 2002/0020821 A1 | 2/2002 | Van Santen et al. ........ 250/492 |

(Continued)

FOREIGN PATENT DOCUMENTS

DD          206 607        2/1984

(Continued)

OTHER PUBLICATIONS

S. Owa et al., "Update on 193nm immersion exposure tool", Litho Forum, International SEMATECH, Los Angeles, Jan. 27-29, 2004, Slide Nos. 1-51.

(Continued)

*Primary Examiner*—Peter B. Kim
(74) *Attorney, Agent, or Firm*—Pillsbury Winthrop Shaw Pittman LLP

(57) ABSTRACT

In an immersion lithography apparatus, a member surrounds a space between a projection system and a substrate table. A seal is formed to contain liquid in the space.

51 Claims, 2 Drawing Sheets

U.S. PATENT DOCUMENTS

| | | | |
|---|---|---|---|
| 2002/0163629 | A1 | 11/2002 | Switkes et al. .............. 355/53 |
| 2003/0123040 | A1 | 7/2003 | Almogy ..................... 355/69 |
| 2003/0174408 | A1 | 9/2003 | Rostalski et al. ........... 359/642 |
| 2004/0000627 | A1 | 1/2004 | Schuster |
| 2004/0021844 | A1 | 2/2004 | Suenaga |
| 2004/0075895 | A1 | 4/2004 | Lin |
| 2004/0109237 | A1 | 6/2004 | Epple et al. |
| 2004/0119954 | A1 | 6/2004 | Kawashima et al. .......... 355/30 |
| 2004/0125351 | A1 | 7/2004 | Krautschik .................. 355/53 |
| 2004/0263809 | A1 | 12/2004 | Nakano |
| 2005/0140948 | A1 | 6/2005 | Tokita |

FOREIGN PATENT DOCUMENTS

| | | |
|---|---|---|
| DD | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO2004/019128 | 3/2004 |
| WO | WO 2004/052954 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090634 A2 | 10/2004 |
| WO | WO 2004/092830 A2 | 10/2004 |
| WO | WO 2004/092830 A3 | 10/2004 |
| WO | WO 2004/093159 A2 | 10/2004 |
| WO | WO 2004/093159 A3 | 10/2004 |

OTHER PUBLICATIONS

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, J. Microlith., Microfab., Microcryst. 1(1):7-12 (2002).

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

U.S. Appl. No. 10/705,783, filed Nov. 12, 2003, Joeri Lof et al.

U.S. Appl. No. 10/743,271, filed Dec. 23, 2003, Helmar Van Santen et al.

U.S. Appl. No. 10/743,266, filed Dec. 23, 2003, Johannes C.H. Mulkens et al.

U.S. Appl. No. 10/724,402, filed Dec. 1, 2003, Klaus Simon et al.

U.S. Appl. No. 10/705,804, filed Nov. 12, 2003, Johannes T. DeSmit et al.

U.S. Appl. No. 10/705,785, filed Nov. 12, 2003, Antonius T.A.M. Derksen et al.

U.S. Appl. No. 10/715,116, filed Nov. 18, 2003, Arno J. Bleeker

U.S. Appl. No. 10/719,683, filed Nov. 24, 2003, Bob Streefkerk et al.

U.S. Appl. No. 10/705,816, filed Nov. 12, 2003, Joeri Lof et al.

U.S. Appl. No. 10/775,326, filed Feb. 11, 2004, Dierichs

U.S. Appl. No. 10/773,461, filed Feb. 9, 2004, Duineveld et al.

U.S. Appl. No. 10/698,012, filed Oct. 31, 2003, Flagello et al.

U.S. Appl. No. 10/367,910, filed Feb. 19, 2003, Suwa et al.

U.S. Appl. No. 10/831,370, filed Apr. 26, 2004, Hoogendam et al.

European Search Report for European Application No. 03257070.7, dated Aug. 24, 2005.

EP Search Report for EP 02257938 dated Sep. 25, 2003.

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

LITHOGRAPHIC APPARATUS AND DEVICE MANUFACTURING METHOD

This application claims priority from European patent application EP 02257822.3, filed Nov. 12, 2002, herein incorporated in its entirety by reference.

FIELD

The present invention relates to immersion lithography.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in a lithographic projection apparatus in a liquid having a relatively high refractive index, e.g. water, so as to fill the space between the final element of the projection lens and the substrate. The point of this is to enable imaging of smaller features since the exposure radiation will have a shorter wavelength in the liquid. (The effect of the liquid may also be regarded as increasing the effective NA of the system.)

However, submersing the wafer table in liquid may mean that there is a large body of liquid that must be accelerated during a scanning exposure. This may require additional or more powerful motors and turbulence in the liquid may lead to undesirable and unpredictable effects.

PCT patent application WO 99/49504 discloses a lithographic apparatus in which a liquid is supplied to the space between the projection lens and the wafer. As the wafer is scanned beneath the lens in a −X direction, liquid is supplied at the +X side of the lens and taken up at the −X side.

SUMMARY

Accordingly, it may be advantageous to provide, for example, a lithographic projection apparatus in which a space between the substrate and the projection system is filled with a liquid while reducing or minimizing the volume of liquid that must be accelerated during stage movements.

According to an aspect, there is provided a lithographic apparatus, comprising:

a support structure configured to hold a patterning device, the patterning device configured to pattern a beam of radiation according to a desired pattern;

a substrate table configured to hold a substrate;

a projection system configured to project the patterned beam onto a target portion of the substrate; and a liquid supply system configured to at least partly fill a space between said projection system and said substrate, with a liquid through which said beam is to be projected, said liquid supply system comprising:

a liquid confinement member extending along at least a part of the boundary of said space, and a seal between said member and the surface of said substrate.

The seal forms a non-contact seal between the member and the substrate so that the liquid is contained in a space between the projection system and the substrate, even as the substrate moves under the projection system, e.g., during a scanning exposure. In an embodiment, the member is held stationary relative to said projection system.

The member may be provided in the form of a closed loop around the space or may be incomplete, e.g. forming a U-shape or even just extending along one side of the space. If the member is incomplete, it should be positioned to confine the liquid as the substrate is scanned under the projection system.

In an embodiment, the seal comprises a gas inlet and a gas outlet formed in a face of said member that opposes said substrate. In an embodiment, the gas seal comprises a gas supply to provide gas under pressure to said gas inlet and a vacuum device to extract gas from said gas outlet. In an embodiment, the gas inlet is located radially outward of said gas outlet. In this way, the gas flow in the gas seal is inward and may most efficiently contain the liquid.

In an embodiment, the gas inlet and gas outlet each comprise a groove in said face of said member opposing said substrate and a plurality of conduits leading into said groove at spaced locations.

In an embodiment, the gap between said member and the surface of said substrate inwardly of said gas seal is small so that capillary action draws liquid into the gap and/or gas from the seal is prevented from entering the space. The balance between the capillary forces drawing liquid under the member and the gas flow pushing it out may form a particularly stable seal.

In an embodiment, the substrate table further comprises a cover plate surrounding said substrate, in use, and having an upper surface substantially coplanar therewith. The cover plate may prevent loss of liquid when the edge of the substrate is scanned under the projection system.

In an embodiment, said liquid is provided to a space between a final lens of the projection system and the substrate.

According to an aspect, there is provided a device manufacturing method comprising:

providing a liquid to fill a space between a substrate and a projection system, a member extending along at least a part of the boundary of said space;

forming a gas seal between said member and the surface of said substrate; and projecting a patterned beam of radiation, through said liquid, onto a target portion of the substrate.

In an embodiment, the member is stationary relative to said projection system.

Although specific reference may be made in this text to the use of the apparatus described herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings, in which.

In the Figures, corresponding reference symbols indicate corresponding parts.

DETAILED DESCRIPTION

Figure 1:
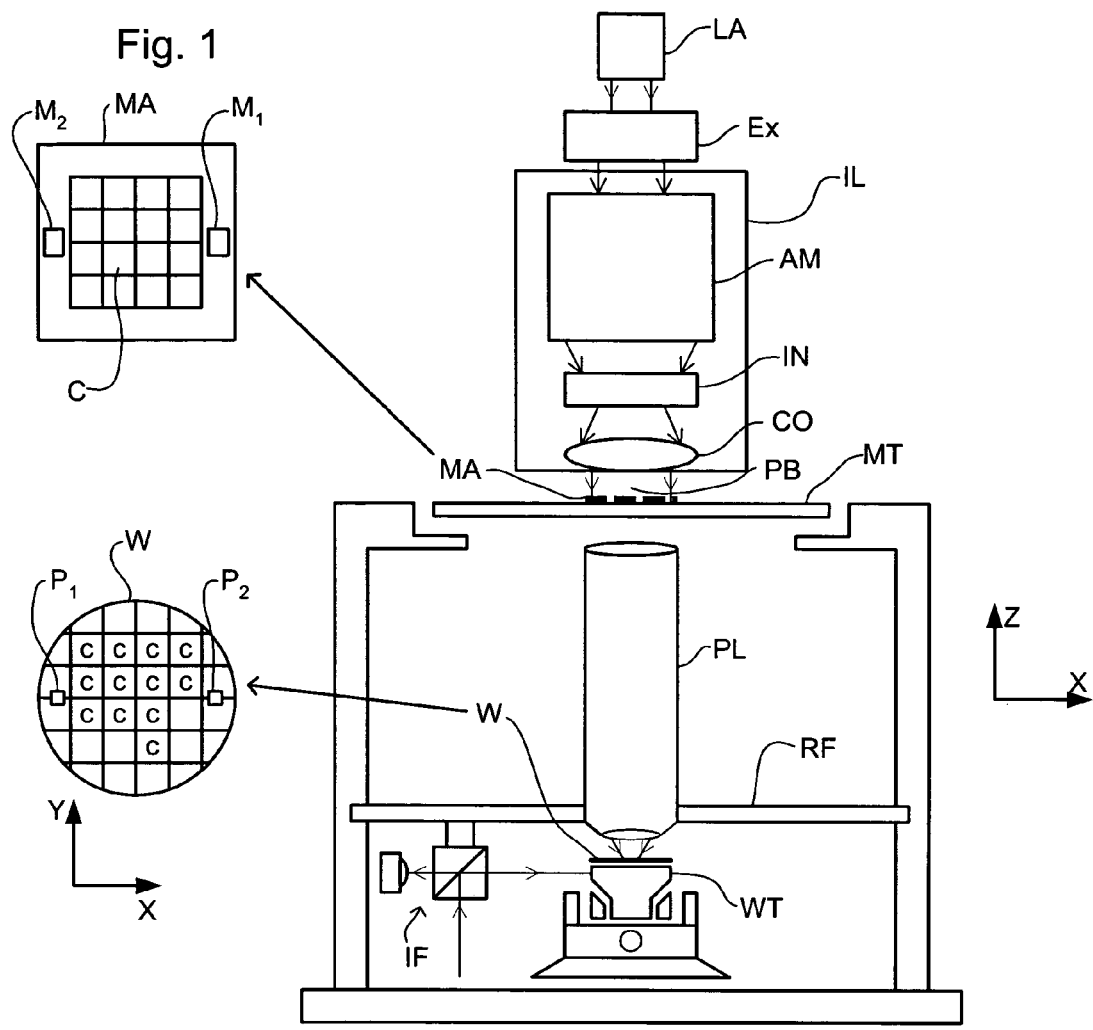
FIG. 1 depicts a lithographic projection apparatus according to an embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. DUV radiation), which in this particular case also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

- In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
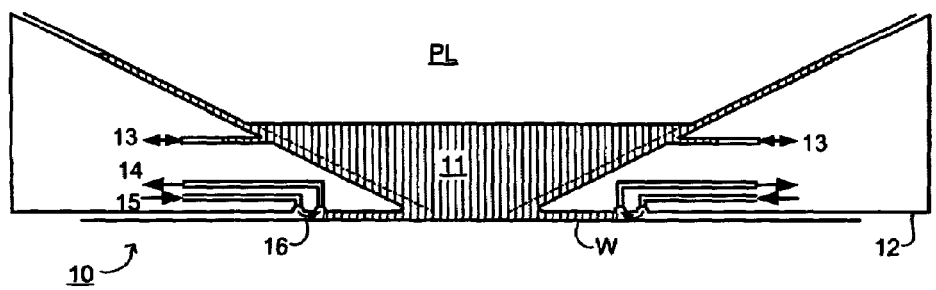
FIG. 2 depicts the liquid reservoir according to an embodiment of the invention.

FIG. 2 shows a liquid reservoir 10 between the projection system PL and the substrate stage. The liquid reservoir 10 is filled with a liquid 11 having a relatively high refractive index, e.g. water, provided via inlet/outlet ports 13. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture.

The reservoir 10 forms a contactless seal to the substrate W around the image field of the projection system PL so that liquid is confined to fill the space between the substrate surface and the final element of the projection system PL. The reservoir is formed by a seal member 12 positioned below and surrounding the final element of the projection system PL. Liquid is brought into the space below the projection system PL and within the seal member 12. The seal member 12 extends a little above the bottom element of the projection system PL and the liquid level rises above the final element so that a buffer of liquid is provided. The seal member 12 has an inner periphery that at the upper end that may closely conform to the step of the projection system PL or the final element thereof and may, e.g. be round. At the bottom, the inner periphery may closely conform to the shape of the image field, e.g. rectangular.

Figure 3:
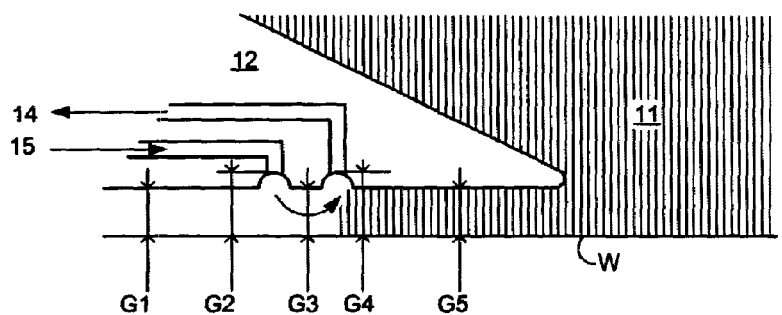
FIG. 3 is an enlarged view of part of the liquid reservoir according to an embodiment of the invention.

The liquid is confined in the reservoir by a gas seal 16 between the bottom of the seal member 12 and the surface of the substrate W. The gas seal is formed by gas, e.g. air or synthetic air, provided under pressure via inlet 15 to the gap between seal member 12 and substrate and extracted via outlet 14. The overpressure on the gas inlet 15, vacuum level on the outlet 14 and geometry of the gap are arranged so that there is a high-velocity gas flow inwards that confines the liquid. This is shown in more detail in FIG. 3.

The gas seal is formed by two (annular) grooves 18, 19 which are connected to the inlet 15 and outlet 14 respectively by a series of small conducts spaced around the grooves. A large (annular) hollow in the seal member may be provided in each of the inlet and outlet to form a manifold.

Gap G1, on the outer side of the gas inlet 15, is small and long so as to provide resistance to gas flow outwards. Gap G2, at the radius of the inlet 15 is a little larger to ensure a sufficient distribution of gas around the seal member, the inlet 15 being formed by a number of small holes around the seal member. Gap G3 is chosen to control the gas flow through the seal. Gap G4 is larger, to provide a good distribution of vacuum, the outlet 14 being formed of a number of small holes in the same or similar manner as the inlet 15. Gap G5 is small, to prevent gas bubbles entering the space and in this embodiment to ensure that capillary action will always fill it with liquid.

The gas seal is thus a balance between the capillary forces pulling liquid into the gap and the gas flow pushing liquid out. As the gap widens from G5 to G4, the capillary forces decrease and the gas flow increases so that the liquid boundary will lie in this region and be stable even as the substrate moves under the projection system PL.

The pressure difference between the inlet at G2 and the outlet at G4 as well as the size and geometry of gap G3, determine the gas flow through the seal 16 and will be determined according to the specific embodiment. However, a possible advantage is achieved if the length of gap G3 is short and absolute pressure at G2 is twice that at G4, in which case the gas velocity will be the speed of sound in the gas and cannot rise any higher. A stable gas flow will therefore be achieved.

The gas outlet system can also be used to completely remove the liquid from the system by reducing the gas inlet pressure and allowing the liquid to enter gap G4. The liquid can then be sucked out by the vacuum system, which can easily be arranged to handle the liquid as well as the gas used to form the seal. Control of the pressure in the gas seal can also be used to ensure a flow of liquid through gap G5 so that liquid in this gap that is heated by friction as the substrate moves does not disturb the temperature of the liquid in the main space below the projection system PL.

The shape of the seal member around the gas inlet and outlet should be chosen to provide laminar flow as far as possible so as to reduce turbulence and vibration. Also, the seal member should be arranged so that the change in flow direction at the liquid interface is as large as possible to provide maximum force confining the liquid.

Figure 4:
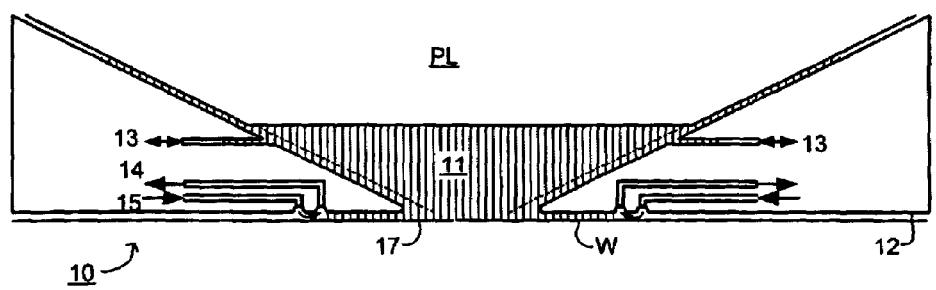
FIG. 4 is a view similar to FIG. 2 showing a cover plate on the substrate table.

FIG. 4 shows a cover plate 17 provided on the substrate table WT. The cover plate 17 has an upper surface substantially coplanar with the substrate W and is closely adjacent the edge of the substrate W so that there is no sudden loss of liquid as the edge of the substrate moves under the projection system PL. A vacuum outlet is, in an embodiment, provided under the gap between the substrate and cover to remove any liquid passing into the gap and also any gas from the gas seal to prevent it entering the space.

While specific embodiments of the invention have been described above, it will be appreciated that the invention may be practiced otherwise than as described. The description is not intended to limit the invention.

The invention claimed is:

1. A lithographic projection apparatus comprising:
   a support structure configured to hold a patterning device, the patterning device configured to pattern a beam of radiation according to a desired pattern;
   a substrate table configured to hold a substrate;
   a projection system configured to project the patterned beam onto a target portion of a substrate; and
   a liquid supply system configured to at least partly fill a space between said projection system and a substrate, with a liquid through which said beam is to be projected, said liquid supply system comprising:
   a liquid confinement structure configured to extend along at least a part of the boundary of said space, configured to remain substantially stationary in a plane substantially parallel to a surface of the substrate and having an inlet configured to supply liquid onto the substrate; and
   a seal between said structure and a surface of a substrate.

2. Apparatus according to claim 1, wherein said seal comprises a gas inlet formed in a face of said structure that opposes a substrate to supply gas and a gas outlet formed in a face of said structure that opposes a substrate to extract gas.

3. Apparatus according to claim 2, wherein said gas seal comprises a gas supply to provide gas under pressure to said gas inlet and a vacuum device to extract gas from said gas outlet.

4. Apparatus according to claim 2, wherein said gas inlet is located radially further from the optical axis of said projection system than is said gas outlet.

5. Apparatus according to claim 2, wherein said gas inlet and said gas outlet each comprise a groove in said face of said structure opposing said substrate and a plurality of conduits leading into said groove at spaced locations.

6. Apparatus according to claim 5, wherein said gas inlet and said gas outlet each comprises a manifold between said conduits and a gas source and a vacuum pump respectively.

7. Apparatus according to claim 1, wherein said seal is configured to use gas, and wherein a gap between said structure and a surface of a substrate inwardly of said gas seal is small so that capillary action at least one of draws liquid into the gap and prevents gas from said gas seal entering said space.

8. Apparatus according to claim 1, wherein said structure forms a closed loop around said space between said projection system and a substrate.

9. Apparatus according to claim 8, wherein said structure has an inner periphery closely conforming to the shape of the image field of said projection system.

10. Apparatus according to claim 1, wherein said substrate table further comprises a cover plate surrounding a substrate, in use, and having an upper surface substantially coplanar therewith.

11. Apparatus according to claim 1, wherein said seal is configured to use gas, and the apparatus further comprises a controller configured to control the gas pressure in said gas seal to control the stiffness between said structure and a substrate.

12. Apparatus according to claim 1, wherein said structure is stationary relative to said projection system.

13. Apparatus according to claim 1, wherein said support structure and said substrate table are movable in a scanning direction to expose a substrate.

14. Apparatus according to claim 1, wherein said liquid supply system comprises at least one outlet to remove liquid after liquid has passed under said projection system.

15. Apparatus according to claim 1, wherein said liquid supply system is configured to at least partly fill a space between a final lens of said projection system and a substrate, with liquid.

16. Apparatus according to claim 1, wherein the seal comprises a seal device configured to form a seal between said structure and the surface of said substrate.

17. An immersion lithographic projection apparatus, comprising:
- a support structure configured to hold a patterning device, the patterning device configured to pattern a beam according to a desired pattern;
- a substrate table configured to hold a substrate;
- a projection system configured to project the patterned beam onto a target portion of the substrate; and
- a liquid confinement structure configured to extend along at least part of the boundary of a localized space on the surface of a substrate, said space configured to contain a liquid through which said beam is to be projected and said structure configured to substantially seal at least part of said space,
- wherein liquid would be substantially prevented from flowing across a portion of a surface of a substrate located outside of the localized space.

18. Apparatus according to claim 17, wherein said support structure and said substrate table are movable in a scanning direction to expose a substrate.

19. Apparatus according to claim 17, wherein said structure comprises at least one inlet to supply liquid onto a substrate and at least one outlet to remove liquid after liquid has passed under said projection system.

20. Apparatus according to claim 17, comprising a gas seal between said structure and a substrate.

21. Apparatus according to claim 20, wherein said gas seal comprises a gas inlet formed in a face of said structure that opposes a substrate to supply gas and a gas outlet formed in a face of said structure that opposes a substrate to extract gas.

22. Apparatus according to claim 20, wherein the gas seal comprises a gas seal device configured to form a gas seal between said structure and the surface of said substrate.

23. A device manufacturing method comprising:
- providing a liquid to fill a space between a substrate and a projection system, a liquid confinement structure extending along at least a part of the boundary of said space;
- forming a gas seal between said structure and the surface of said substrate; and
- projecting a patterned beam of radiation, through said liquid, onto a target portion of the substrate.

24. Method according to claim 23, wherein forming said gas seal comprises supplying a gas through a gas inlet formed in a face of said structure that opposes said substrate and extracting gas through a gas outlet formed in a face of said structure that opposes said substrate.

25. Method according to claim 24, comprising supplying said gas at a position radially further from the optical axis of said projection system than said extracting of gas.

26. Method according to claim 23, comprising maintaining the gap between said structure and the surface of said substrate inwardly of said gas seal small so that capillary action at least one of draws liquid into the gap and prevents gas from said gas seal entering said space.

27. Method according to claim 23, wherein said structure forms a closed loop around said space between said projection system and said substrate.

28. Method according to claim 27, wherein said structure has an inner periphery closely conforming to the shape of the image field of said projection system.

29. Method according to claim 23, further comprising controlling the gas pressure in said gas seal to control the stiffness between said structure and said substrate.

30. Method according to claim 23, comprising moving said support structure and said substrate table in a scanning direction to expose said substrate.

31. Method according to claim 23, comprising supplying said liquid onto the substrate and removing said liquid after said liquid has passed under said projection system.

32. Method according to claim 23, wherein providing a liquid to fill comprises providing a liquid to fill a space between a substrate and a final lens of said projection system.

33. An immersion lithographic projection apparatus comprising:
- a support structure configured to hold a patterning device and movable in a scanning direction, the patterning device configured to pattern a beam of radiation according to a desired pattern;
- a substrate table configured to hold a substrate and movable in a scanning direction;
- a projection system configured to project the patterned beam onto a target portion of a substrate using a scanning exposure;
- a liquid confinement structure configured to substantially seal at least part of a space bounded by a surface of a substrate and the periphery of a localized portion of said surface; and
- a liquid inlet to provide a liquid, through which said beam is to be projected, to said space,
- wherein liquid would be substantially prevented from flowing across a portion of a surface of a substrate located outside of the space.

34. Apparatus according to claim 33, wherein said inlet is configured to supply liquid onto a substrate and comprising an outlet to remove liquid after liquid has passed under said projection system.

35. Apparatus according to claim 33, comprising a gas seal between said structure and a surface of a substrate.

36. Apparatus according to claim 35, wherein said gas seal comprises a gas inlet formed in a face of said structure that opposes said surface to supply gas and a gas outlet formed in a face of said structure that opposes said surface to extract gas.

37. Apparatus according to claim 35, wherein the gas seal comprises a gas seal device configured to form a gas seal between said structure and the surface of said substrate.

38. Apparatus according to claim 33, wherein said periphery conforms to a shape of an image field of said projection system.

39. A lithographic projection apparatus comprising:
- a support structure configured to hold a patterning device and movable in a scanning direction, the patterning device configured to pattern a beam of radiation according to a desired pattern;
- a substrate table configured to hold a substrate and movable in a scanning direction;
- a projection system configured to project the patterned beam onto a target portion of the substrate using a scanning exposure;
- a liquid confinement structure having an aperture having a cross-sectional area smaller than a surface area of a substrate;
- a seal between said structure and a substrate; and a liquid inlet to provide a liquid, through which said beam is to be projected, to said aperture.

40. Apparatus according to claim 39, wherein said inlet is configured to supply liquid onto a substrate and comprising an outlet to remove liquid after said liquid has passed under said projection system.

41. Apparatus according to claim 39, wherein said seal is a gas seal.

42. Apparatus according to claim 41, wherein said gas seal comprises a gas inlet formed in a face of said structure that opposes a surface of a substrate to supply gas and a gas outlet formed in a face of said structure that opposes a surface of a substrate to extract gas.

43. Apparatus according to claim 39, wherein said aperture has a periphery conforming to a shape of an image field of said projection system.

44. Apparatus according to claim 39, wherein the seal comprises a seal device configured to form a seal between said structure and the surface of said substrate.

45. An immersion lithographic projection apparatus comprising:
- a support structure configured to hold a patterning device, the patterning device configured to pattern a beam of radiation according to a desired pattern;
- a substrate table configured to hold a substrate;
- a projection system configured to project the patterned beam onto a target portion of the substrate;
- a liquid confinement structure that can substantially confine all of a liquid provided to an area of a radiation-sensitive surface of a substrate under said projection system, said area being smaller than the entire area of said substrate surface; and
- a liquid inlet to provide a liquid to said area and between said projection system and said substrate surface.

46. Apparatus according to claim 45, wherein said support structure and said substrate table are movable in a scanning direction to expose a substrate.

47. Apparatus according to claim 46, wherein said inlet is configured to supply liquid to a substrate surface and comprising an outlet to remove liquid after liquid has passed under said projection system.

48. Apparatus according to claim 47, wherein said inlet is configured to supply said liquid at a first side of said projection system and said outlet is configured to remove liquid at a second side of said projection system as a substrate is moved under said projection system in a direction from the first side to the second side.

49. Apparatus according to claim 45, wherein said structure comprises a gas seal.

50. Apparatus according to claim 49, wherein said gas seal comprises a gas inlet formed in a face of said structure that opposes a substrate surface and a gas outlet formed in a face of said structure that opposes a substrate surface.

51. Apparatus according to claim 45, wherein said area has a periphery conforming to a shape of an image field of said projection system.

* * * * *